United States Patent
Ueda et al.

(10) Patent No.: US 12,543,502 B2
(45) Date of Patent: Feb. 3, 2026

(54) PIEZOELECTRIC COAXIAL SENSOR AND METHOD FOR MANUFACTURING PIEZOELECTRIC COAXIAL SENSOR

(71) Applicant: Fujikura Ltd., Tokyo (JP)

(72) Inventors: Sho Ueda, Chiba (JP); Haruhiko Tsuboi, Tokyo (JP); Korenari Higashi, Tokyo (JP)

(73) Assignee: Fujikura Ltd., Tokyo (JP)

( * ) Notice: Subject to any disclaimer, the term of this patent is extended or adjusted under 35 U.S.C. 154(b) by 819 days.

(21) Appl. No.: 17/910,236

(22) PCT Filed: Mar. 3, 2021

(86) PCT No.: PCT/JP2021/008067
§ 371 (c)(1),
(2) Date: Sep. 8, 2022

(87) PCT Pub. No.: WO2021/182208
PCT Pub. Date: Sep. 16, 2021

(65) Prior Publication Data
US 2023/0131853 A1  Apr. 27, 2023

(30) Foreign Application Priority Data
Mar. 9, 2020  (JP) .................................. 2020-040227

(51) Int. Cl.
*H10N 30/60* (2023.01)
*H10N 30/02* (2023.01)
(Continued)

(52) U.S. Cl.
CPC ............. *H10N 30/60* (2023.02); *H10N 30/02* (2023.02); *H10N 30/302* (2023.02);
(Continued)

(58) Field of Classification Search
CPC ....... H10N 30/60; H10N 30/302; H10N 30/88
See application file for complete search history.

(56) References Cited

U.S. PATENT DOCUMENTS 6,204,756 B1 * 3/2001 Senyk ................. B60R 21/0136
340/436
6,268,682 B1 * 7/2001 Audren ..................... H02N 2/10
310/368
(Continued)

FOREIGN PATENT DOCUMENTS

CN          1089758 A       7/1994
CN        105190224 A      12/2015
(Continued)

OTHER PUBLICATIONS

International Search Report issued in corresponding International Application No. PCT/JP2021/008067, mailed Jun. 8, 2021 (3 pages).

*Primary Examiner* — Bryan P Gordon
(74) *Attorney, Agent, or Firm* — Osha Bergman Watanabe & Burton LLP

(57) ABSTRACT

A piezoelectric coaxial sensor includes: a sensor portion including a center conductor having a linear shape, a polymer piezoelectric layer containing polyvinylidene fluoride and that covers an outer peripheral surface of the center conductor, and a first outer conductor that surrounds an outer peripheral surface of the polymer piezoelectric layer; and jacket layers that each include a film having a tape shape wound to surround an outer peripheral surface of the sensor portion. The film of at least one of the jacket layers exposed to the outside of the piezoelectric coaxial sensor among the other jacket layers is adhered to a member in contact with an adhesive layer by the adhesive layer. The adhesive layer includes a thermoplastic resin having a melting point of 120° C. or lower.

10 Claims, 9 Drawing Sheets

(51) Int. Cl.
*H10N 30/30* (2023.01)
*H10N 30/857* (2023.01)
*H10N 30/88* (2023.01)
*G01L 1/16* (2006.01)

(52) U.S. Cl.
CPC ........... *H10N 30/857* (2023.02); *H10N 30/88* (2023.02); *G01L 1/16* (2013.01)

(56) References Cited

U.S. PATENT DOCUMENTS

| | | | |
|---|---|---|---|
| 6,526,834 | B1 | 3/2003 | Kohler |
| 2018/0325384 | A1* | 11/2018 | Agarwal ............... H10N 30/098 |
| 2020/0037989 | A1* | 2/2020 | Taniguchi ............. B06B 1/0633 |
| 2021/0119106 | A1* | 4/2021 | Yoshida ................ H10N 30/857 |

FOREIGN PATENT DOCUMENTS

| | | | |
|---|---|---|---|
| CN | 108574038 | A | 9/2018 |
| GB | 2203587 | A | 10/1988 |
| JP | S54-161552 | A | 12/1979 |
| JP | H09-153631 | A | 6/1997 |
| JP | 2005351664 | A | 12/2005 |
| JP | 2008-181755 | A | 8/2008 |
| JP | 2011192666 | A | 9/2011 |
| JP | 2017183570 | A | 10/2017 |
| JP | 2018153085 | A | 9/2018 |
| JP | 2018-173305 | A | 11/2018 |
| JP | 6501958 | B1 | 4/2019 |
| KR | 20000017064 | A | 3/2000 |
| WO | 2011099457 | A1 | 8/2011 |
| WO | 2019117037 | A1 | 6/2019 |

* cited by examiner

PIEZOELECTRIC COAXIAL SENSOR AND METHOD FOR MANUFACTURING PIEZOELECTRIC COAXIAL SENSOR

TECHNICAL FIELD

The present invention relates to a piezoelectric coaxial sensor in which deterioration of output characteristics is suppressed, and a method for manufacturing the piezoelectric coaxial sensor.

BACKGROUND

A piezoelectric coaxial sensor in which a piezoelectric element is arranged between a center conductor and an outer conductor of a coaxial cable is known. The piezoelectric coaxial sensor, by sensing a voltage of the piezoelectric element generated when a force is applied from an outer peripheral surface of the sensor via the center conductor and the outer conductor, detects the force. Using this property, deformation of an object to be measured on which the piezoelectric coaxial sensor is provided, a force applied to the object to be measured, vibrations, and the like are detected. As the piezoelectric element of such a piezoelectric coaxial sensor, a piezoelectric element using a polymer piezoelectric body made of polyvinylidene fluoride (PVDF) is known.

Patent Literature 1 below describes such a piezoelectric coaxial sensor. The piezoelectric coaxial sensor includes a center conductor, a polymer piezoelectric layer including PVDF covering an outer peripheral surface of the center conductor, an outer conductor surrounding an outer peripheral surface of the polymer piezoelectric layer, and an insulating layer that is a jacket layer covering an outer peripheral surface of the outer conductor. The jacket layer is formed by extrusion molding.

[Patent Literature 1] JP 2017-183570 A

However, the piezoelectric coaxial sensor described in Patent Literature 1 above tends to have a small output. This is considered to be because the polarization of PVDF decreases when the jacket layer is formed by extrusion molding. Therefore, there is a demand for forming the jacket layer by tape winding. In the case of tape winding, at least a tape constituting the jacket exposed to the outside needs to be fixed by adhesion. In the case of using a tape having adhesiveness, there is a demand for using an adhesive including a thermoplastic resin during manufacturing, but when such an adhesive is used, there is a concern about deterioration of output characteristics due to a decrease in polarization of PVDF at the time of heating.

SUMMARY

Embodiments of the present invention provide a piezoelectric coaxial sensor in which deterioration of output characteristics is suppressed, and a method for manufacturing the piezoelectric coaxial sensor.

In one or more embodiments, a piezoelectric coaxial sensor of the present invention includes: a sensor portion including a center conductor having a linear shape, a polymer piezoelectric layer containing polyvinylidene fluoride and configured to cover an outer peripheral surface of the center conductor, and a first outer conductor configured to surround an outer peripheral surface of the polymer piezoelectric layer; and at least one jacket layer configured to include a film having a tape shape wound so as to surround an outer peripheral surface of the sensor portion, in which the film of the jacket layer exposed to outside among the jacket layers is adhered to a member in contact with an adhesive layer including a thermoplastic resin having a melting point of 120° C. or lower by the adhesive layer.

In addition, in one or more embodiments, a method for manufacturing a piezoelectric coaxial sensor of the present invention includes: a preparation step of preparing a sensor portion including a center conductor having a linear shape, a polymer piezoelectric layer containing polyvinylidene fluoride and configured to cover an outer peripheral surface of the center conductor, and a first outer conductor configured to surround an outer peripheral surface of the polymer piezoelectric layer; and a jacket layer forming step of forming at least one jacket layer including a film having a tape shape wound so as to surround an outer peripheral surface of the sensor portion, in which the jacket layer forming step includes an exposed jacket forming step of forming the jacket layer exposed to outside among the jacket layers, and the exposed jacket forming step includes: a winding step of winding the film to be the jacket layer exposed to the outside around an outer peripheral surface of a member in contact with an adhesive layer including a thermoplastic resin having a melting point of 120° C. or lower via the adhesive layer so as to surround the outer peripheral surface of the sensor portion; and an adhering step of heating the sensor portion around which the film to be the jacket layer exposed to the outside is wound at 120° C. or lower to adhere the film to the member by the adhesive layer.

The present inventor fixed the film to the sensor portion at various temperatures using an adhesive layer including a thermoplastic resin as an adhesive. As a result, it has been found that when the polymer piezoelectric layer of the piezoelectric coaxial sensor contains PVDF, deterioration of output characteristics is suppressed by heating at 120 degrees or lower. This is considered to be because a decrease in polarization of PVDF is suppressed by heating under such conditions. Thus, with the piezoelectric coaxial sensor of one or more embodiments of the present invention, since the jacket layer exposed to the outside can be formed by heating at 120° C. or lower, it is possible to suppress a decrease in polarization of PVDF. Thus, in the piezoelectric coaxial sensor, deterioration of output characteristics can be suppressed. In addition, with the method for manufacturing the piezoelectric coaxial sensor of one or more embodiments of the present invention, since the jacket layer exposed to the outside by heating at 120° C. or lower is formed, it is possible to manufacture the piezoelectric coaxial sensor with which it is possible to suppress a decrease in polarization of PVDF and in which deterioration of output characteristics is suppressed.

In addition, the thermoplastic resin may contain an ethylene-vinyl acetate copolymer.

In this case, the adhesive layer can have a melting point of 120 degrees or lower.

In addition, in one or more embodiments, the piezoelectric coaxial sensor described above includes a first jacket layer configured to include one or more of the jacket layers and cover the outer peripheral surface of the sensor portion; a second outer conductor configured to surround an outer peripheral surface of the first jacket layer; and a second jacket layer configured to include one or more of the jacket layers and cover an outer peripheral surface of the second outer conductor, in which an outermost jacket layer of the second jacket layer is the jacket layer exposed to the outside.

In addition, in one or more embodiments, the method for manufacturing a piezoelectric coaxial sensor described above includes: a first jacket layer forming step of forming a first jacket layer configured to include one or more of the jacket layers and cover the outer peripheral surface of the sensor portion; a second outer conductor forming step of forming a second outer conductor configured to surround an outer peripheral surface of the first jacket layer; and a second jacket layer forming step of forming a second jacket layer configured to include one or more of the jacket layers and cover an outer peripheral surface of the second outer conductor, in which an outermost jacket layer of the second jacket layer is the jacket layer exposed to the outside.

In such a piezoelectric coaxial sensor and a method for manufacturing the piezoelectric coaxial sensor, the second outer conductor acts as a shield layer, and it is possible to suppress an influence of an external electromagnetic field or the like from reaching the center conductor or the first outer conductor. Thus, it is possible to suppress noise from being superimposed on the center conductor and the first outer conductor due to an external electromagnetic field or the like. Therefore, the piezoelectric coaxial sensor can have excellent noise resistance characteristics. Note that the noise resistance characteristics are characteristics for suppressing external noise, and when the noise resistance is high, the S/N ratio is high. In addition, the second jacket layer can insulate the outer peripheral surface of the second outer conductor that acts as a shield layer from the outside. Thus, it is possible to further suppress noise from being superimposed on the center conductor and the first outer conductor via the second outer conductor.

In addition, when the piezoelectric coaxial sensor includes the first jacket layer, the second outer conductor, and the second jacket layer as described above, in one or more embodiments, the first jacket layer includes an inner first jacket layer that covers the outer peripheral surface of the sensor portion and in which the film is not adhered to the sensor portion, and an outer first jacket layer that covers an outer peripheral surface of the inner first jacket layer and in which the film is adhered to the inner first jacket layer by the adhesive layer.

In addition, when the method for manufacturing a piezoelectric coaxial sensor includes the first jacket layer forming step, the second outer conductor forming step, and the second jacket layer forming step as described above, in one or more embodiments, the first jacket layer forming step includes an inner first jacket layer forming step of forming an inner first jacket layer that covers the outer peripheral surface of the sensor portion and in which the film is not adhered to the sensor portion, and an outer first jacket layer forming step of forming an outer first jacket layer that covers an outer peripheral surface of the inner first jacket layer and in which the film is adhered to the inner first jacket layer by the adhesive layer, and the outer first jacket layer forming step includes: an outer first jacket layer winding step of winding the film to be the outer first jacket layer around the outer peripheral surface of the inner first jacket layer via the adhesive layer, and an outer first jacket layer adhering step of heating the inner first jacket layer around which the film to be the outer first jacket layer is wound in the outer first jacket layer winding step and the sensor portion at 120° C. or lower and adhering the film to be the outer first jacket layer to the inner first jacket layer by the adhesive layer.

With such a piezoelectric coaxial sensor and a method for manufacturing the piezoelectric coaxial sensor, since the inner first jacket layer is not adhered to the sensor portion, it is easy to lead out the sensor portion. In addition, since the outer first jacket layer is adhered to the inner first jacket layer, the first jacket layer is prevented from unraveling even when the piezoelectric coaxial sensor is bent. In addition, with such a piezoelectric coaxial sensor, since the first jacket layer can be formed by heating at 120° C. or lower, it is possible to suppress a decrease in polarization of PVDF, and it is possible to suppress deterioration of output characteristics. In addition, according to such a method for manufacturing the piezoelectric coaxial sensor, since the first jacket layer is formed by heating at 120° C. or lower, it is possible to suppress a decrease in polarization of PVDF.

In addition, when the piezoelectric coaxial sensor includes the first jacket layer, the second outer conductor, and the second jacket layer as described above, in one or more embodiments, the second jacket layer includes an inner second jacket layer that covers the outer peripheral surface of the second outer conductor and in which the film is not adhered to the second outer conductor, and an outer second jacket layer that is an outermost jacket layer of the second jacket layer, covers an outer peripheral surface of the inner second jacket layer, and in which the film is adhered to the inner second jacket layer by the adhesive layer.

In addition, when the method for manufacturing the piezoelectric coaxial sensor includes the first jacket layer forming step, the second outer conductor forming step, and the second jacket layer forming step as described above, in one or more embodiments, the second jacket layer forming step includes an inner second jacket layer forming step of forming an inner second jacket layer that covers the outer peripheral surface of the second outer conductor and in which the film is not adhered to the second outer conductor, and an outer second jacket layer forming step of forming an outer second jacket layer that is an outermost jacket layer of the second jacket layer, covers an outer peripheral surface of the inner second jacket layer, and in which the film is adhered to the inner second jacket layer by the adhesive layer, and the outer second jacket layer forming step includes the exposed jacket forming step.

With such a piezoelectric coaxial sensor and a method for manufacturing the piezoelectric coaxial sensor, since the inner second jacket layer is not adhered to the second outer conductor, it is easy to lead out the second outer conductor. In addition, since the outer second jacket layer is adhered to the inner second jacket layer, the second jacket layer is prevented from unraveling even when the piezoelectric coaxial sensor is bent. In addition, with such a piezoelectric coaxial sensor, since the second jacket layer can be formed by heating at 120° C. or lower, it is possible to suppress a decrease in polarization of PVDF, and it is possible suppress deterioration of output characteristics. In addition, according to such a method for manufacturing the piezoelectric coaxial sensor, since the second jacket layer is formed by heating at 120° C. or lower, it is possible to suppress a decrease in polarization of PVDF.

As described above, according to embodiments of the present invention, a piezoelectric coaxial sensor in which deterioration of output characteristics is suppressed, and a method for manufacturing the piezoelectric coaxial sensor are provided.

DETAILED DESCRIPTION

Aspects for carrying out the piezoelectric coaxial sensor according to the present invention will be illustrated below together with the accompanying drawings. The embodiments illustrated below are for facilitating the understanding of the present invention, and are not for limiting the interpretation of the present invention. The present invention can be changed or modified from the embodiments below without departing from the spirit. In addition, in the present specification, the dimensions of each member may be exaggerated for ease of understanding.

Figure 1:
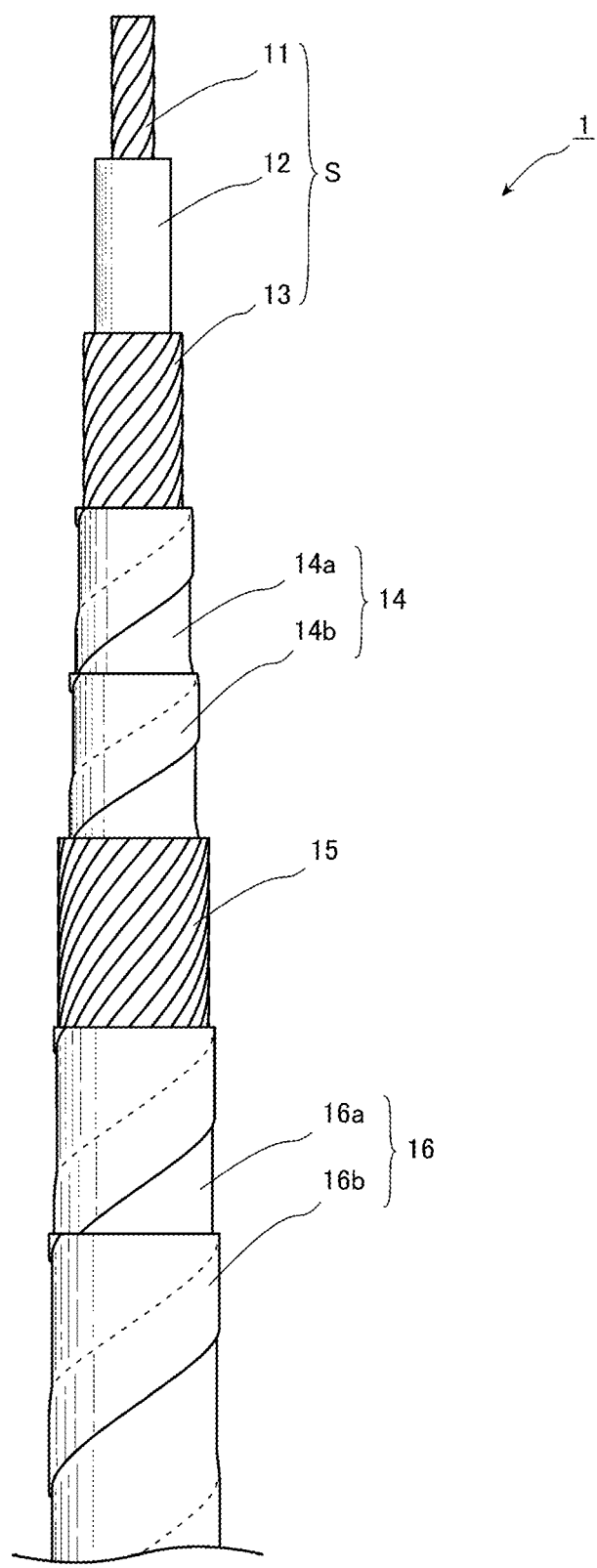
FIG. 1 is a diagram illustrating a piezoelectric coaxial sensor according to one or more embodiments of the present invention.

FIG. 1 is a diagram illustrating a piezoelectric coaxial sensor according to one or more embodiments. As illustrated in FIG. 1, a piezoelectric coaxial sensor 1 of one or more embodiments includes a center conductor 11, a polymer piezoelectric layer 12, a first outer conductor 13, a first jacket layer 14, a second outer conductor 15, and a second jacket layer 16.

The center conductor 11 is a conductor having a linear shape including stranded wires of a plurality of conductive wire materials. The center conductor 11 is not particularly limited as long as it is a conductor, and examples thereof include a conductor including copper, aluminum, a tin-plated soft copper alloy, or the like. Note that FIG. 1 illustrates an example in which the center conductor 11 includes the stranded wires of the plurality of conductive wire materials as described above, but the center conductor 11 may be a conductor having a linear shape including a conductive single wire.

The polymer piezoelectric layer 12 is a layer covering the outer peripheral surface of the center conductor 11. In one or more embodiments, the polymer piezoelectric layer 12 is in contact with the outer peripheral surface of the center conductor 11. The polymer piezoelectric layer 12 exhibits piezoelectricity and includes a polymer containing PVDF. The polymer piezoelectric layer 12 is formed to have a substantially circular outer shape in cross section by extrusion molding or the like. Note that the polymer piezoelectric layer 12 may be constituted by winding a film having a tape shape including a polymer piezoelectric body containing PVDF around the center conductor 11. In this case, the film may be wound in a spiral winding or in a longitudinal winding.

The first outer conductor 13 is a conductor surrounding the outer peripheral surface of the polymer piezoelectric layer 12. In one or more embodiments, the first outer conductor 13 is in contact with the outer peripheral surface of the polymer piezoelectric layer 12. The first outer conductor 13 has a configuration in which a plurality of conductive wires is spirally wound in the same direction. Such a first outer conductor 13 is not particularly limited as long as it includes a conductor, but includes, for example, the same conductor as the center conductor 11. Note that FIG. 1 illustrates an example in which the plurality of conductive wires is spirally wound as the first outer conductor 13, and the first outer conductor 13 may be a mesh wire in which a plurality of conductive wires is braided.

The center conductor 11, the polymer piezoelectric layer 12, and the first outer conductor 13 configured as described above constitute a sensor portion S. Note that, as described above, the polymer piezoelectric layer 12 is in contact with the outer peripheral surface of the center conductor 11, and the first outer conductor 13 is in contact with the outer peripheral surface of the polymer piezoelectric layer 12. Therefore, in the sensor portion S, when an external force applied to the piezoelectric coaxial sensor 1 is transmitted to the polymer piezoelectric layer 12 and an inductive charge is generated in the polymer piezoelectric layer 12, a voltage is generated between the center conductor 11 and the first outer conductor 13 on the basis of the inductive charge generated in the polymer piezoelectric layer 12. Therefore, by inducing the voltage between the center conductor 11 and the first outer conductor 13 to the outside of the piezoelectric coaxial sensor 1 and measuring the voltage, it is possible to measure the force applied to the piezoelectric coaxial sensor 1.

Figure 2:
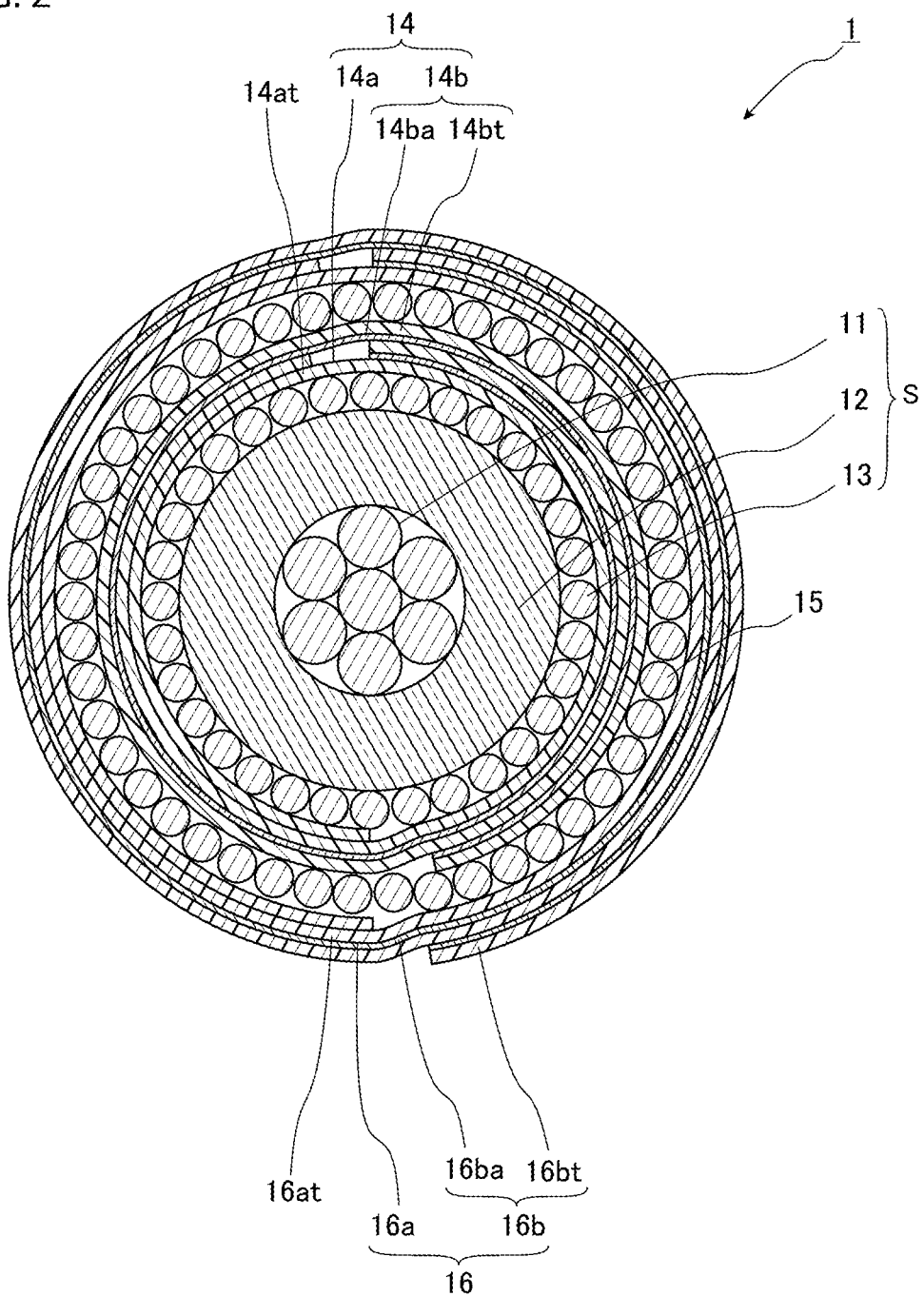
FIG. 2 is a diagram illustrating a structure in a cross section perpendicular to a longitudinal direction of the piezoelectric coaxial sensor in FIG. 1.

FIG. 2 is a diagram illustrating a structure in a cross section perpendicular to a longitudinal direction of the piezoelectric coaxial sensor 1 in FIG. 1. The first jacket layer 14 is a layer covering the outer peripheral surface of the first outer conductor 13. Thus, the first jacket layer 14 covers the outer peripheral surface of the sensor portion S. As illustrated in FIGS. 1 and 2, in one or more embodiments, the first jacket layer 14 includes two jacket layers: an inner first jacket layer 14a and an outer first jacket layer 14b.

The inner first jacket layer 14a includes a film 14at having a tape shape including resin, and the film 14at is spirally wound on the outer peripheral surface of the first outer conductor 13. No adhesive layer is provided on any surface of the film 14at, and the inner first jacket layer 14a is not adhered to the first outer conductor 13. The material of the film 14at is not particularly limited, and examples thereof include insulating resins such as polyethylene terephthalate, polyethylene naphthalate, polyimide, polyvinyl chloride, polypropylene, polyetheretherketone, polyetherimide, polyphenylene sulfide, and the like. Note that an adhesive layer may be provided on one surface of the film 14at, but in this case, from the viewpoint that the inner first jacket layer 14a and the first outer conductor 13 can be easily separated when the first outer conductor 13 is led out, the adhesive layer may be provided on the surface of the film 14at that is the outer side of the inner first jacket layer 14a.

As illustrated in FIG. 2, the outer first jacket layer 14b is the outermost jacket layer of the first jacket layer 14, and includes a film 14bt having a tape shape including resin and an adhesive layer 14ba provided on one surface of the film 14bt. The adhesive layer 14ba faces the inner first jacket layer 14a side, and the film 14bt is spirally wound on the outer peripheral surface of the inner first jacket layer 14a. Thus, the adhesive layer 14ba is in contact with the inner first jacket layer 14a, and the film 14bt is adhered to the inner first jacket layer 14a by the adhesive layer 14ba. Note that, in the example of FIG. 1, the film 14*bt* of the outer first jacket layer 14*b* is wound in the same direction as the film 14*at* of the inner first jacket layer 14*a*, but the film 14*bt* of the outer first jacket layer 14*b* and the film 14*at* of the inner first jacket layer 14*a* may be wound in the opposite directions. In addition, at least one of the film 14*at* and the film 14*bt* may be wound in a longitudinal winding. The material of the film 14*bt* is not particularly limited, and examples thereof include the same material as the film 14*at*. The adhesive used for the adhesive layer 14*ba* includes a thermoplastic resin having a melting point of 120° C. or lower. Examples of such a resin include an ethylene-vinyl acetate copolymer (EVA). By containing EVA, the melting point of the thermoplastic resin can be 120° C. or lower.

Note that, as described above, when the adhesive layer is provided on the surface of the film 14*at* that is the outer side of the inner first jacket layer 14*a*, since the adhesive layer is exposed on the outer peripheral surface of the inner first jacket layer 14*a*, the adhesive layer may not be provided on any surface of the film 14*bt*, and the adhesive layer 14*ba* may be provided on the surface of the film 14*bt* on the inner first jacket layer 14*a* side as described above. In addition, as described above, even when the adhesive layer is not provided on any surface of the film 14*at*, the adhesive layer 14*ba* may not be provided, but from the viewpoint of suppressing the film 14*bt* from being unraveled when the piezoelectric coaxial sensor 1 is repeatedly bent, the adhesive layer 14*ba* may be provided as described above.

In addition, one of the inner first jacket layer 14*a* and the outer first jacket layer 14*b* may be omitted, and the first jacket layer 14 may include the other of the inner first jacket layer 14*a* and the outer first jacket layer 14*b*. However, from the viewpoint of suppressing the unraveling of the first jacket layer 14 while allowing the first jacket layer 14 and the first outer conductor 13 to be easily separated, the first jacket layer 14 may include the inner first jacket layer 14*a*, which is not adhered as described above, and the outer first jacket layer 14*b* including the adhesive layer 14*ba*.

The second outer conductor 15 is a conductor surrounding the outer peripheral surface of the first jacket layer 14. The second outer conductor 15 has a configuration in which a plurality of conductive wires is spirally wound in the same direction. Such a second outer conductor 15 is not particularly limited as long as it includes a conductor, but includes, for example, the same conductor as the first outer conductor 13. Note that FIG. 1 illustrates an example in which the plurality of conductive wires is spirally wound as the second outer conductor 15, the second outer conductor 15 may be a mesh wire in which a plurality of conductive wires is braided.

The second jacket layer 16 is a layer covering the outer peripheral surface of the second outer conductor 15. In one or more embodiments, the second jacket layer 16 includes two jacket layers: an inner second jacket layer 16*a* and an outer second jacket layer 16*b*.

The inner second jacket layer 16*a* includes a film 16*at* having a tape shape including resin, and the film 16*at* is spirally wound on the outer peripheral surface of the second outer conductor 15. No adhesive layer is provided on any surface of the film 16*at*, and the inner second jacket layer 16*a* is not adhered to the second outer conductor 15. The material of the film 16*at* is not particularly limited, and examples thereof include the same material as the film 14*at*. Note that an adhesive layer may be provided on one surface of the film 16*at*, but in this case, from the viewpoint that the inner second jacket layer 16*a* and the second outer conductor 15 can be easily separated when the second outer conductor 15 is led out, the adhesive layer may be provided on the surface of the film 16*at* that is the outer side of the inner second jacket layer 16*a*.

As illustrated in FIGS. 1 and 2, the outer second jacket layer 16*b* is the outermost jacket layer of the second jacket layer 16 and is a jacket layer exposed to the outside. The outer second jacket layer 16*b* includes a film 16*bt* having a tape shape including resin and an adhesive layer 16*ba* provided on one surface of the film 16*bt*. The adhesive layer 16*ba* faces the inner second jacket layer 16*a* side, and the film 16*bt* is spirally wound on the outer peripheral surface of the inner second jacket layer 16*a*. Thus, the adhesive layer 16*ba* is in contact with the inner second jacket layer 16*a*, and the film 16*bt* is adhered to the inner second jacket layer 16*a* by the adhesive layer 16*ba*. Note that, in the example of FIG. 1, the film 16*bt* of the outer second jacket layer 16*b* is wound in the same direction as the film 16*at* of the inner second jacket layer 16*a*, but the film 16*bt* of the outer second jacket layer 16*b* and the film 16*at* of the inner second jacket layer 16*a* may be wound in the opposite directions. In addition, at least one of the film 16*at* and the film 16*bt* may be wound in a longitudinal winding. The material of the film 16*bt* is not particularly limited, and examples thereof include the same material as the film 16*at*. The adhesive used for the adhesive layer 16*ba* includes a thermoplastic resin having a melting point of 120° C. or lower. Thus, the adhesive used for the adhesive layer 16*ba* includes, for example, the same thermoplastic resin as the thermoplastic resin used for the adhesive layer 14*ba*.

Note that, as described above, when the adhesive layer is provided on the surface of the film 16*at* that is the outer side of the inner second jacket layer 16*a*, since the adhesive layer is exposed on the outer peripheral surface of the inner second jacket layer 16*a*, the adhesive layer may not be provided on any surface of the film 16*bt*, and the adhesive layer 16*ba* may be provided on the surface of the film 16*bt* on the inner second jacket layer 16*a* side as described above.

In addition, the inner second jacket layer 16*a* may be omitted, and the second jacket layer 16 may include the outer second jacket layer 16*b*. However, from the viewpoint of suppressing the unraveling of the second jacket layer 16 while allowing the second jacket layer 16 and the second outer conductor 15 to be easily separated, the second jacket layer 16 may include the inner second jacket layer 16*a*, which is not adhered as described above, and the outer second jacket layer 16*b* including the adhesive layer 16*ba*.

As described above, the piezoelectric coaxial sensor 1 of one or more embodiments includes the sensor portion S including the center conductor 11 having a linear shape, the polymer piezoelectric layer 12 containing PVDF covering the outer peripheral surface of the center conductor 11, and the first outer conductor 13 surrounding the outer peripheral surface of the polymer piezoelectric layer 12, and at least one jacket layer including a film having a tape shape wound so as to surround the outer peripheral surface of the sensor portion S, the film 16*bt* of the outer second jacket layer 16*b* exposed to the outside among the jacket layers is adhered to the inner second jacket layer 16*a* in contact with the adhesive layer 16*ba* by the adhesive layer 16*ba* including a thermoplastic resin having a melting point of 120° C. or lower.

In the piezoelectric coaxial sensor 1 having such a configuration, the outer second jacket layer 16*b* exposed to the outside by heating at 120° C. or lower can be formed. Thus, a decrease in polarization of PVDF can be suppressed. Thus, in the piezoelectric coaxial sensor 1 of one or more embodiments, deterioration of output characteristics can be suppressed.

In addition, since the thermoplastic resin constituting the adhesive layer 16ba contains an ethylene-vinyl acetate copolymer, the melting point of the adhesive layer 16ba can be set to 120° C. or lower.

In addition, the piezoelectric coaxial sensor 1 of one r more embodiments includes the first jacket layer 14 including one or more jacket layers and covering the outer peripheral surface of the sensor portion S, the second outer conductor 15 surrounding the outer peripheral surface of the first jacket layer 14, and the second jacket layer 16 including one or more jacket layers and covering the outer peripheral surface of the second outer conductor 15, and the outer second jacket layer 16b that is the outermost jacket layer of the second jacket layer 16 is a jacket layer exposed to the outside. In such a piezoelectric coaxial sensor 1, the second outer conductor 15 acts as a shield layer, and it is possible to suppress an influence of an external electromagnetic field or the like from reaching the center conductor 11 or the first outer conductor 13. Thus, it is possible to suppress noise from being superimposed on the center conductor 11 and the first outer conductor 13 due to an external electromagnetic field or the like. Therefore, the piezoelectric coaxial sensor 1 can have excellent noise resistance characteristics. In addition, the second jacket layer 16 can insulate the outer peripheral surface of the second outer conductor 15 that acts as a shield layer from the outside. Thus, since the second outer conductor 15 can be unfailingly grounded, the second outer conductor 15 acts as a shield layer, and noise can be further suppressed from being superimposed on the center conductor 11 and the first outer conductor 13.

In addition, in the piezoelectric coaxial sensor 1 of one or more embodiments, the first jacket layer 14 includes the inner first jacket layer 14a that covers the outer peripheral surface of the sensor portion S and in which the film 14at is not adhered to the sensor portion S, and the outer first jacket layer 14b that covers the outer peripheral surface of the inner first jacket layer 14a and in which the film 14bt is adhered to the inner first jacket layer 14a by the adhesive layer 14ba. With such a piezoelectric coaxial sensor 1, since the inner first jacket layer 14a is not adhered to the sensor portion S, it is easy to lead out the sensor portion S. Thus, the first outer conductor 13 can be easily connected to another member. In addition, since the outer first jacket layer 14b is adhered to the inner first jacket layer 14a, the first jacket layer 14 is prevented from unraveling even when the piezoelectric coaxial sensor 1 is bent. In addition, with such a piezoelectric coaxial sensor 1, since the first jacket layer 14 can be formed by heating at 120° C. or lower, it is possible to suppress a decrease in polarization of PVDF, and it is possible to suppress deterioration of output characteristics.

In addition, in the piezoelectric coaxial sensor 1 of one or more embodiments, the second jacket layer 16 includes the inner second jacket layer 16a that covers the outer peripheral surface of the second outer conductor 15 and in which the film 16at is not adhered to the second outer conductor 15, and the outer second jacket layer 16b that is the outermost jacket layer of the second jacket layer 16, covers the outer peripheral surface of the inner second jacket layer 16a, and in which the film 16bt is adhered to the inner second jacket layer 16a by the adhesive layer 16ba. With such a piezoelectric coaxial sensor 1, since the inner second jacket layer 16a is not adhered to the second outer conductor 15, it is easy to lead out the second outer conductor 15. Thus, the second outer conductor 15 can be easily connected to another member such as a gland. In addition, since the outer second jacket layer 16b is adhered to the inner second jacket layer 16a, the second jacket layer 16 is prevented from unraveling even when the piezoelectric coaxial sensor 1 is bent. In addition, with such a piezoelectric coaxial sensor 1, since the second jacket layer 16 can be formed by heating at 120° C. or lower, it is possible to suppress a decrease in polarization of PVDF, and it is possible to suppress deterioration of output characteristics.

Next, a method for manufacturing the piezoelectric coaxial sensor 1 will be described.

Figure 3:
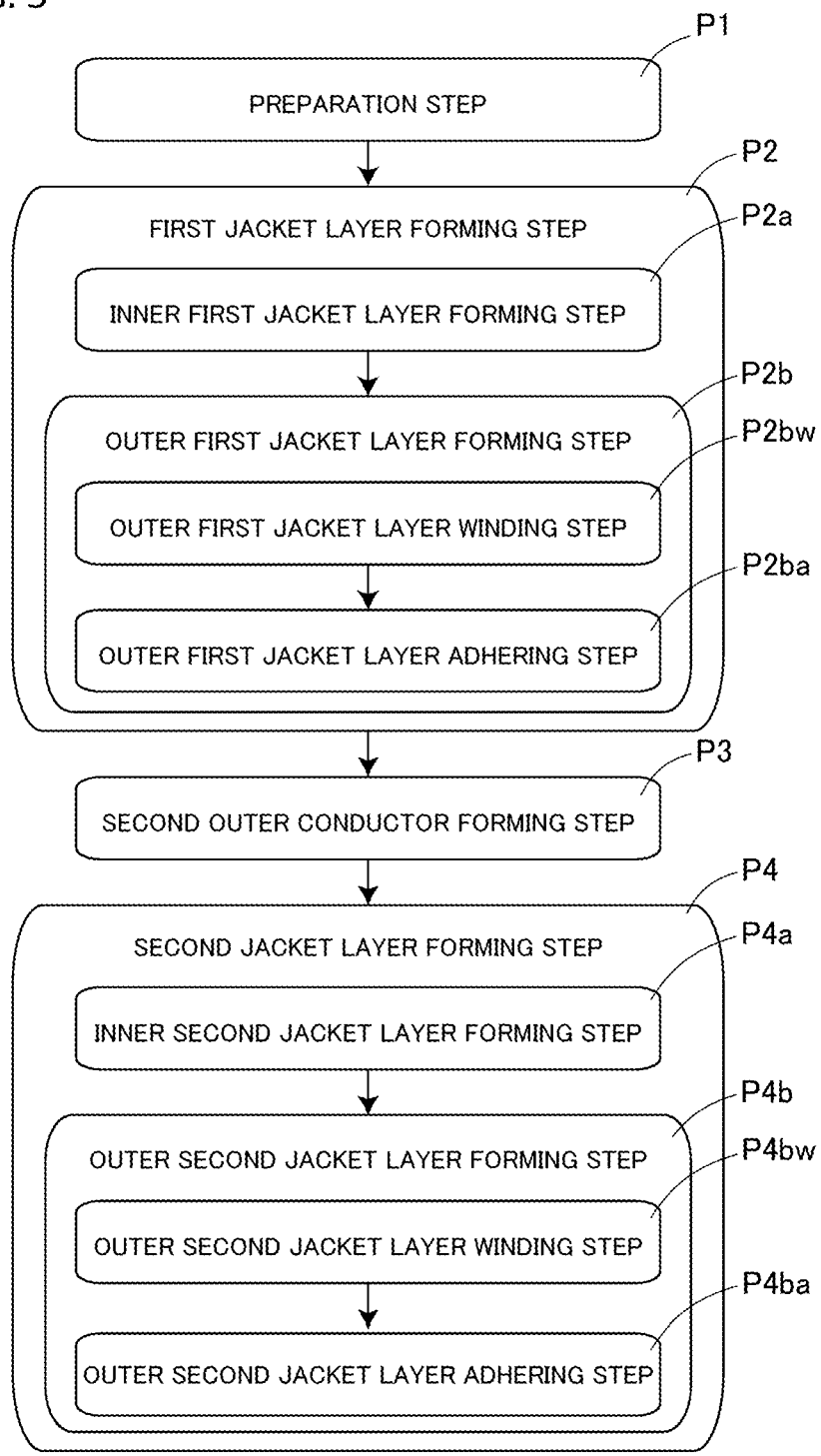
FIG. 3 is a flowchart illustrating a step of manufacturing the piezoelectric coaxial sensor of FIG. 1.

FIG. 3 is a flowchart illustrating a step of manufacturing the piezoelectric coaxial sensor 1 of FIG. 1. As illustrated in FIG. 3, a method for manufacturing the piezoelectric coaxial sensor 1 of one or more embodiments includes a preparation step P1, a first jacket layer forming step P2, a second outer conductor forming step P3, and a second jacket layer forming step P4.

<Preparation Step P1>

Figure 4:
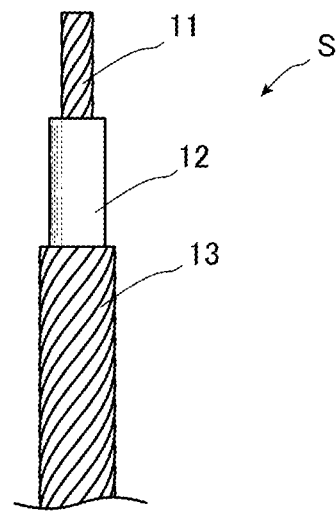
FIG. 4 is a diagram illustrating a state after a preparation step.

This step is a step of preparing the sensor portion S. As described above, the sensor portion S includes the center conductor 11, the polymer piezoelectric layer 12, and the first outer conductor 13. Thus, first, the center conductor 11 having a linear shape is prepared. Then, the polymer piezoelectric layer 12 containing PVDF is formed on the outer peripheral surface of the center conductor 11. In the case of the polymer piezoelectric layer 12 illustrated in FIGS. 1 and 2, the polymer piezoelectric layer 12 is formed by extrusion molding. In addition, unlike FIGS. 1 and 2, in a case where the polymer piezoelectric layer 12 is constituted by winding a film having a tape shape including a polymer piezoelectric body containing PVDF around the center conductor 11, the film is wound around the center conductor 11 in a spiral winding or in a longitudinal winding. Next, the first outer conductor 13 is formed on the outer peripheral surface of the polymer piezoelectric layer 12 formed around the center conductor 11. In the case of the first outer conductor 13 illustrated in FIG. 1, a plurality of conductive wires is spirally wound on the outer peripheral surface of the polymer piezoelectric layer 12. Alternatively, when the first outer conductor 13 is a mesh wire in which a plurality of conductive wires is braided, the plurality of conductive wires is interwoven on the outer peripheral surface of the polymer piezoelectric layer 12 to form a mesh wire. In this way, the sensor portion S illustrated in FIG. 4 is prepared.

Note that the sensor portion S may be prepared by a method other than the above steps. For example, the sensor portion S may be prepared by purchasing the sensor portion S from the outside.

First Jacket Layer Forming Step P2>

This step is a step of forming the first jacket layer 14. As illustrated in FIG. 3, this step includes an inner first jacket layer forming step P2a and an outer first jacket layer forming step P2b.

<<Inner First Jacket Layer Forming Step P2a>>

Figure 5:
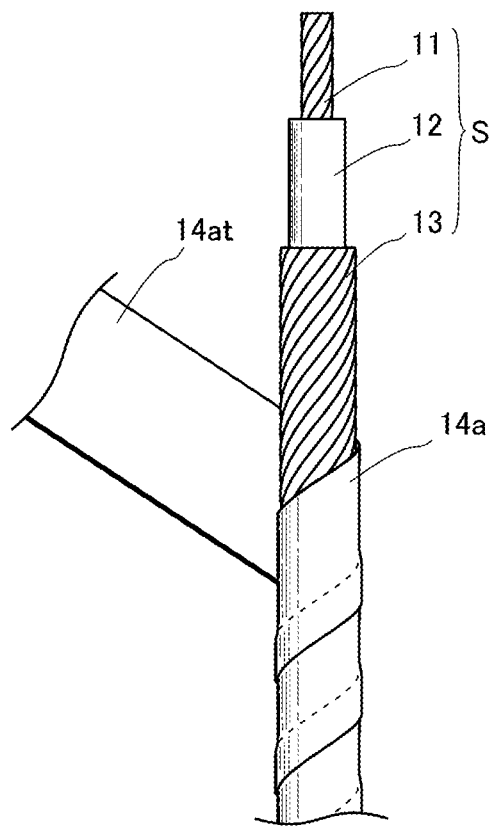
FIG. 5 is a diagram illustrating a state of an inner first jacket layer forming step.

This step is a step of forming the inner first jacket layer 14a that covers the outer peripheral surface of the sensor portion S and in which the film 14at is not adhered to the sensor portion S. FIG. 5 is a diagram illustrating a state of this step. As illustrated in FIG. 5, in this step, the film 14at having no adhesive layer formed on both surfaces is prepared, and the film 14at is wound on the outer peripheral surface of the sensor portion S in a spiral winding. Note that, unlike FIG. 5, when the film 14at is wound in a longitudinal winding, the film 14at is wound in a longitudinal winding on the outer peripheral surface of the sensor portion S. In this way, the inner first jacket layer 14a is formed.

Note that, as described above, when the adhesive layer is provided on the surface of the film 14*at*, the film 14*at* is wound on the outer peripheral surface of the sensor portion S so that the surface of the film 14*at* on which the adhesive layer is provided is on the outer side. In this case, the film 14*at* is a member in contact with the adhesive layer.

<<Outer First Jacket Layer Forming Step P2*b*>>

This step is a step of forming the outer first jacket layer 14*b* that covers the outer peripheral surface of the inner first jacket layer 14*a* and in which the film 14*bt* is adhered to the inner first jacket layer 14*a* by the adhesive layer 14*ba*. This step includes an outer first jacket layer winding step P2*bw* and an outer first jacket layer adhering step P2*ba*.

(Outer First Jacket Layer Winding Step P2*bw*)

Figure 6:
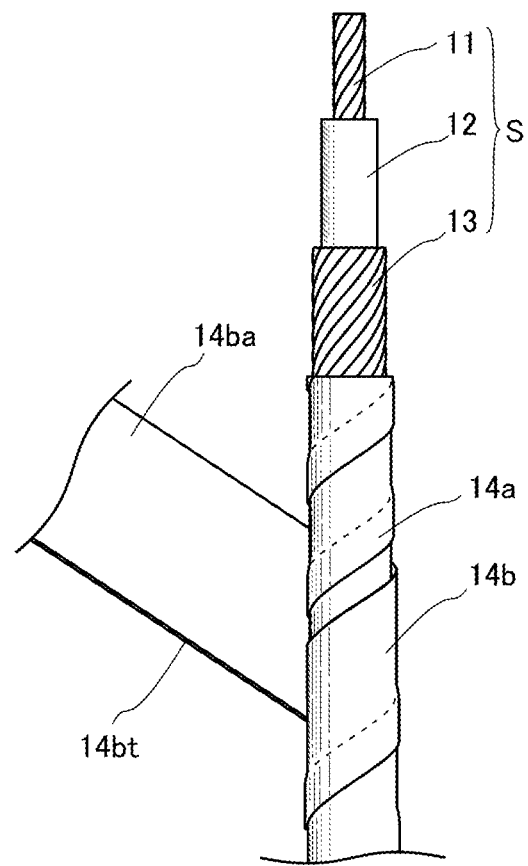
FIG. 6 is a diagram illustrating a state of an outer first jacket layer winding step.

This step is a step of winding the film 14*bt*, which is to be the outer first jacket layer 14*b*, around the outer peripheral surface of the inner first jacket layer 14*a*. FIG. 6 is a diagram illustrating a state of this step. As illustrated in FIG. 6, in this step, the film 14*bt* provided with the adhesive layer 14*ba* is prepared, and the film 14*bt* is wound on the outer peripheral surface of the inner first jacket layer 14*a* in a spiral winding so that the adhesive layer 14*ba* is in contact with the inner first jacket layer 14*a*. Note that, unlike FIG. 6, when the film 14*bt* is wound in a longitudinal winding, the film 14*bt* is wound in a longitudinal winding on the outer peripheral surface of the inner first jacket layer 14*a* so that the adhesive layer 14*ba* is in contact with the inner first jacket layer 14*a*. In this way, the adhesive layer 14*ba* is in contact with the inner first jacket layer 14*a*, and the film 14*bt* is in a state of being wound on the outer peripheral surface of the inner first jacket layer 14*a*. Note that, in this step, the film 14*bt* surrounds the outer peripheral surface of the sensor portion S via the inner first jacket layer 14*a*.

Note that when the film 14*at* is wound on the outer peripheral surface of the sensor portion S such that the adhesive layer is provided on the surface of the film 14*at* and the surface of the film 14*at* on which the adhesive layer is provided is on the outer side as described above, the film 14*bt* not provided with the adhesive layer 14*ba* may be wound on the outer peripheral surface of the inner first jacket layer 14*a* via the adhesive layer on the film 14*at*, and the film 14*bt* provided with the adhesive layer 14*ba* may be wound on the outer peripheral surface of the inner first jacket layer 14*a* as described above.

In this way, the film 14*bt*, which is to be the outer first jacket layer 14*b*, is wound around the outer peripheral surface of the inner first jacket layer 14*a* via the adhesive layer.

Note that, as described above, in the first jacket layer forming step P2, the adhesive layer may not be provided on either surface of the film 14*at* and the film 14*bt*.

(Outer First Jacket Layer Adhering Step P2*ba*)

Figure 7:
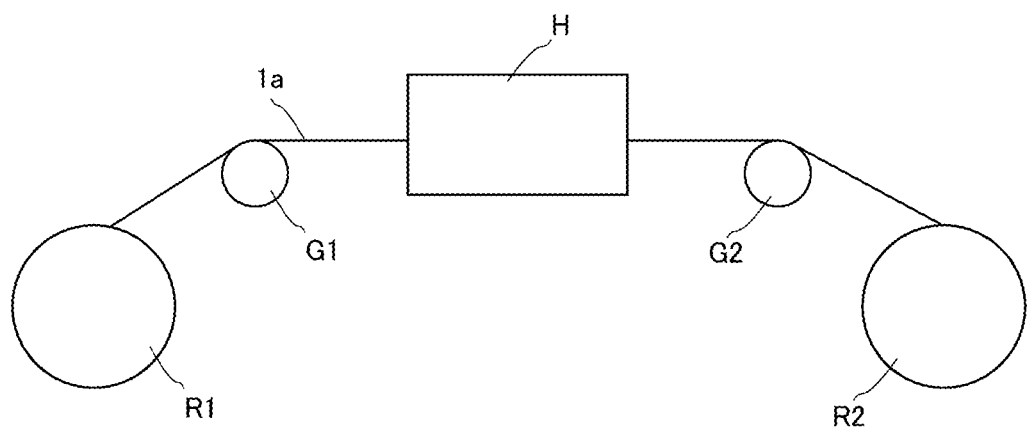
FIG. 7 is a diagram illustrating a state of an outer first jacket layer adhering step.

This step is a step of adhering the film 14*bt* of the outer first jacket layer 14*b* to the inner first jacket layer 14*a* by the adhesive layer 14*ba*. In this step, the inner first jacket layer 14*a* around which the film 14*bt* is wound and the sensor portion S are heated at 120° C. or lower, so that the film 14*bt* is adhered to the inner first jacket layer 14*a* by the adhesive layer 14*ba*. FIG. 7 is a diagram illustrating a state of this step. In this step of one or more embodiments, in a state where the film 14*bt* is wound as described above, a heating target body 1*a* including the film 14*bt*, the inner first jacket layer 14*a*, and the sensor portion S is passed through a heating furnace H to heat the heating target body 1*a*.

The heating target body 1*a* thus heated is wound around a reel R1 before passing through the heating furnace H. The heating target body 1*a* fed from the reel R1 is changed in direction by a guide roller G1 and is passed through the heating furnace H. The temperature in the heating furnace H is adjusted so as to be equal to or higher than the melting point of the adhesive layer 14*ba* and 120° C. or lower. When the adhesive layer 14*ba* contains EVA as described above, the temperature in the heating furnace H is adjusted to be, for example, 100° C. or higher and 120° C. or lower. Note that the melting point of EVA is 110° C. The length of the heating furnace H is, for example, 1 m or more and 2 m or less. In addition, the speed of movement of the heating target body 1*a* is, for example, 1 m/min or more and 5 m/min or less. However, the temperature in the heating furnace H, the length of the heating furnace H, and the speed of movement of the heating target body 1*a* are not particularly limited as long as the adhesive layer 14*ba* is heated to the melting point or higher and 120° C. or lower in the heating furnace H. The heating target body 1*a* that has passed through the heating furnace H is changed in direction by a guide roller G2 and is wound around a reel R2. Note that a cooling section is provided between the heating furnace H and the guide roller G2. The length of the cooling section is not particularly limited as long as it is the length over which the adhesive layer 14*ba* can be solidified, and is, for example, 3 m or more.

In this way, the film 14*bt* of the outer first jacket layer 14*b* is adhered to the inner first jacket layer 14*a* by the adhesive layer 14*ba*, and the first jacket layer 14 is formed.

Note that, as described above, when the adhesive layer is provided on the surface of the film 14*at* and the adhesive layer 14*ba* is not provided on the film 14*bt*, the film 14*bt* of the outer first jacket layer 14*b* is adhered to the inner first jacket layer 14*a* by the adhesive layer provided on the film 14*at*. In addition, when the adhesive layer is provided on the surface of the film 14*at* and the adhesive layer 14*ba* is also provided on the film 14*bt*, the film 14*bt* of the outer first jacket layer 14*b* is adhered to the inner first jacket layer 14*a* by the adhesive layer provided on the film 14*at* and the adhesive layer 14*ba* provided on the film 14*bt*.

<Second Outer Conductor Forming Step P3>

Figure 8:
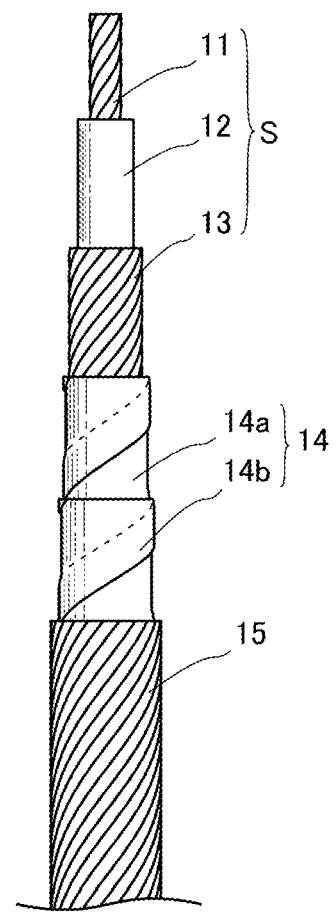
FIG. 8 is a diagram illustrating a state after a second outer conductor forming step.

This step is a step of forming the second outer conductor 15 surrounding the outer peripheral surface of the first jacket layer 14. In the case of the second outer conductor 15 illustrated in FIG. 1, in this step, the plurality of conductive wires is spirally wound on the outer peripheral surface of the first jacket layer 14. Alternatively, when the second outer conductor 15 is a mesh wire in which a plurality of conductive wires is braided, the plurality of conductive wires is interwoven on the outer peripheral surface of the first jacket layer 14 to form a mesh wire. In this way, the second outer conductor 15 is formed as illustrated in FIG. 8.

<Second Jacket Layer Forming Step P4>

This step is a step of forming the second jacket layer 16. As illustrated in FIG. 3, this step includes an inner second jacket layer forming step P4*a* and an outer second jacket layer forming step P4*b*.

<<Inner Second Jacket Layer Forming Step P4*a*>>

Figure 9:
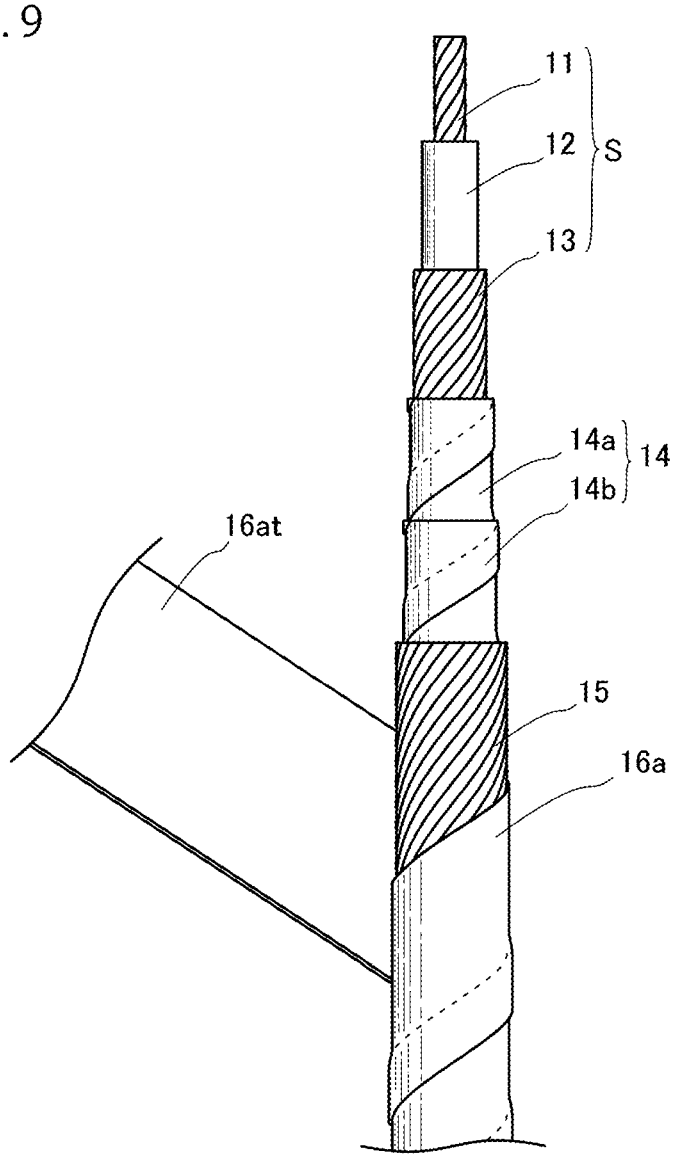
FIG. 9 is a diagram illustrating a state of an inner second jacket layer forming step.

This step is a step of forming the inner second jacket layer 16*a* that covers the outer peripheral surface of the second outer conductor 15 and in which the film 16*at* is not adhered to the second outer conductor 15. FIG. 9 is a diagram illustrating a state of this step. As illustrated in FIG. 9, in this step, the film 16*at* having no adhesive layer formed on both surfaces is prepared, and the film 16*at* is wound on the outer peripheral surface of the second outer conductor 15 in a spiral winding. Note that, unlike FIG. 9, when the film 16*at* is wound in a longitudinal winding, the film 16*at* is wound in a longitudinal winding on the outer peripheral surface of the second outer conductor 15. In this way, the inner second jacket layer 16a is formed.

Note that, as described above, when the adhesive layer is provided on the film 16at of the inner second jacket layer 16a, the film 16at is wound on the outer peripheral surface of the second outer conductor 15 so that the surface of the film 16at on which the adhesive layer is provided faces the outer side. In this case, the film 16at is a member in contact with the adhesive layer.

<<Outer Second Jacket Layer Forming Step P4b>>

This step is a step of forming the outer second jacket layer 16b that covers the outer peripheral surface of the inner second jacket layer 16a and in which the film 16bt is adhered to the inner second jacket layer 16a by the adhesive layer. As described above, since the outer second jacket layer 16b is a jacket layer exposed to the outside, this step can be understood as an exposed jacket forming step. This step includes an outer second jacket layer winding step P4bw and an outer second jacket layer adhering step P4ba.

(Outer Second Jacket Layer Winding Step P4bw)

Figure 10:
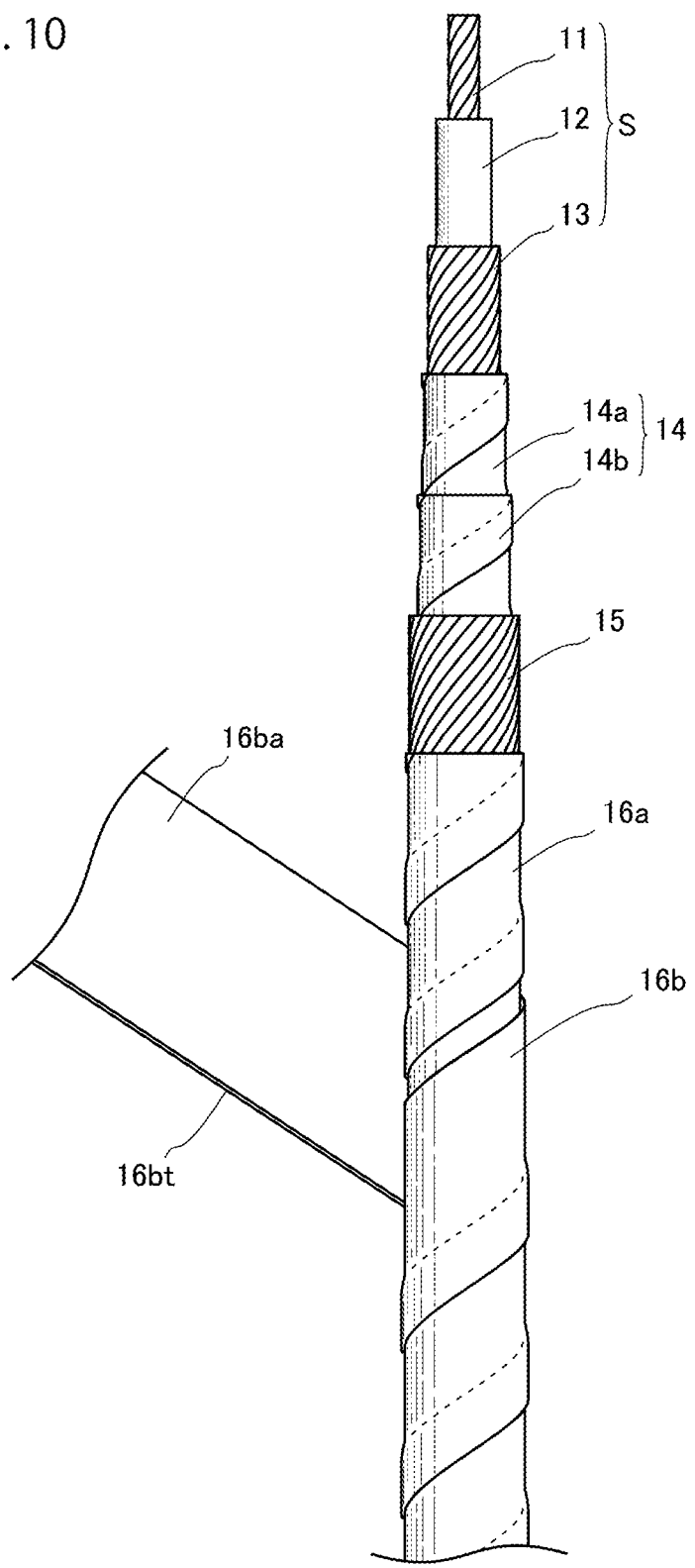
FIG. 10 is a diagram illustrating a state of an outer second jacket layer winding step.

This step is a step of winding the film 16bt provided with the adhesive layer 16ba around the outer peripheral surface of the inner second jacket layer 16a. FIG. 10 is a diagram illustrating a state of this step. As illustrated in FIG. 10, in this step, the film 16bt provided with the adhesive layer 16ba is prepared, and the film 16bt is wound on the outer peripheral surface of the inner second jacket layer 16a in a spiral winding so that the adhesive layer 16ba is in contact with the inner second jacket layer 16a. Note that, unlike FIG. 10, when the film 16bt is wound in a longitudinal winding, the film 16bt is wound in a longitudinal winding on the outer peripheral surface of the inner second jacket layer 16a so that the adhesive layer 16ba is in contact with the inner second jacket layer 16a. In this way, the adhesive layer 16ba is in contact with the inner second jacket layer 16a, and the film 16bt is in a state of being wound on the outer peripheral surface of the inner second jacket layer 16a. Note that, in this step, the film 16bt surrounds the outer peripheral surface of the sensor portion S via the inner second jacket layer 16a, the second outer conductor 15, and the first jacket layer 14.

Note that when the film 16at is wound on the outer peripheral surface of the second outer conductor 15 such that the adhesive layer is provided on the surface of the film 16at and the surface of the film 16at on which the adhesive layer is provided is on the outer side as described above, the film 16bt not provided with the adhesive layer 16ba may be wound on the outer peripheral surface of the inner second jacket layer 16a via the adhesive layer on the film 16at, and the film 16bt provided with the adhesive layer 16ba may be wound on the outer peripheral surface of the inner second jacket layer 16a as described above.

In this way, the film 16bt, which is to be the outer second jacket layer 16b, is wound around the outer peripheral surface of the inner second jacket layer 16a via the adhesive layer.

(Outer Second Jacket Layer Adhering Step P4ba)

This step is a step of adhering the film 16bt of the outer second jacket layer 16b to the inner second jacket layer 16a by the adhesive layer 16ba. In this step, the inner second jacket layer 16a around which the film 16bt is wound, the second outer conductor 15, the first jacket layer 14, and the sensor portion S are heated at 120° C. or lower, so that the film 16bt is adhered to the inner second jacket layer 16a by the adhesive layer 16ba. In this step of one or more embodiments, the outer first jacket layer adhering step P2ba illustrated in FIG. 7 is similarly performed. In this case, the heating target body 1a includes the inner second jacket layer 16a around which the film 16bt is wound, the second outer conductor 15, the first jacket layer 14, and the sensor portion S. When the heating target body 1a is passed through the heating furnace H, the heating target body 1a is heated, and the adhesive layer 16ba that has passed through the heating furnace H is solidified, so that the film 16bt is adhered to the inner second jacket layer 16a.

Note that the temperature in the heating furnace H, the length of the heating furnace H, and the speed of movement of the heating target body 1a in this step are not particularly limited as long as the adhesive layer 16ba is heated to the melting point or higher and 120° C. or lower in the heating furnace H, and may be different from the temperature in the heating furnace H, the length of the heating furnace H, and the speed of movement of the heating target body 1a in the outer first jacket layer adhering step P2ba.

In this way, the film 16bt of the outer second jacket layer 16b is adhered to the inner second jacket layer 16a by the adhesive layer 16ba, and the piezoelectric coaxial sensor 1 illustrated in FIGS. 1 and 2 is manufactured.

Note that, as described above, when the adhesive layer is provided on the surface of the film 16at and the adhesive layer 16ba is not provided on the film 16bt, the film 16bt of the outer second jacket layer 16b is adhered to the inner second jacket layer 16a by the adhesive layer provided on the film 16at. In addition, when the adhesive layer is provided on the surface of the film 16at and the adhesive layer 16ba is also provided on the film 16bt, the film 16bt of the outer second jacket layer 16b is adhered to the inner second jacket layer 16a by the adhesive layer provided on the film 16at and the adhesive layer 16ba provided on the film 16bt.

The present manufacturing method includes a jacket layer forming step of forming a plurality of jacket layers. That is, the jacket layer forming step of forming a plurality of jacket layers includes the inner first jacket layer forming step P2a, the outer first jacket layer forming step P2b, the inner second jacket layer forming step P4a, and the outer second jacket layer forming step P4b.

As described above, the method for manufacturing the piezoelectric coaxial sensor 1 of one or more embodiments includes the preparation step P1 of preparing the sensor portion S, and the jacket layer forming step of forming at least one jacket layer including the film having a tape shape wound so as to surround the outer peripheral surface of the sensor portion S. The jacket layer forming step includes the outer second jacket layer forming step P4b, which is an exposed jacket forming step, of forming a jacket layer exposed to the outside among the jacket layers. The outer second jacket layer forming step P4b includes the outer second jacket layer winding step P4bw of winding the film 16bt provided with the adhesive layer 16ba including a thermoplastic resin having a melting point of 120° C. or lower so as to surround the outer peripheral surface of the sensor portion S, and the outer second jacket layer adhering step P4ba of heating the sensor portion S around which the film 16bt is wound at 120° C. or lower and adhering the film 16bt to the inner second jacket layer 16a, which is a member in contact with the adhesive layer 16ba, by the adhesive layer 16ba.

With such a method for manufacturing the piezoelectric coaxial sensor 1, 1 since the jacket layer exposed to the outside by heating at 120° C. or lower is formed, it is possible to manufacture the piezoelectric coaxial sensor 1 with which it is possible to suppress a decrease in polarization of PVDF and in which deterioration of output characteristics is suppressed.

In addition, in the method for manufacturing the piezoelectric coaxial sensor 1 of one or more embodiments, since the thermoplastic resin of the adhesive layer 16*ba* contains an ethylene-vinyl acetate copolymer, the adhesive layer can have a melting point of 120 degrees or lower.

In addition, the method for manufacturing the piezoelectric coaxial sensor 1 of one or more embodiments includes the first jacket layer forming step P2 of forming the first jacket layer 14 including the plurality of jacket layers and covering the outer peripheral surface of the sensor portion S, the second outer conductor forming step P3 of forming the second outer conductor 15 surrounding the outer peripheral surface of the first jacket layer 14, and the second jacket layer forming step P4 of forming the second jacket layer 16 including the plurality of jacket layers and covering the outer peripheral surface of the second outer conductor 15. The outer second jacket layer 16*b*, which is the outermost jacket layer of the second jacket layer 16, is a jacket layer exposed to the outside. In such a method for manufacturing the piezoelectric coaxial sensor 1, it is possible to manufacture the piezoelectric coaxial sensor 1 in which the second outer conductor 15 acts as a shield layer, has excellent noise resistance characteristics, and the outer peripheral surface of the second outer conductor 15 acting as the shield layer can be insulated from the outside by the second jacket layer 16.

In addition, in the method for manufacturing the piezoelectric coaxial sensor 1 of one or more embodiments, the first jacket layer forming step P2 includes the inner first jacket layer forming step P2*a* of forming the inner first jacket layer 14*a* that covers the outer peripheral surface of the sensor portion S and in which the film 14*at* is not adhered to the sensor portion S, and the outer first jacket layer forming step P2*b* of forming the outer first jacket layer 14*b* that covers the outer peripheral surface of the inner first jacket layer 14*a* and in which the film 14*bt* is adhered to the inner first jacket layer 14*a* by the adhesive layer 14*ba*, and the outer first jacket layer forming step P2*b* includes the outer first jacket layer winding step P2*bw* of winding the film 14*bt* provided with the adhesive layer 14*ba* around the outer peripheral surface of the inner first jacket layer 14*a*, and the outer first jacket layer adhering step P2*ba* of heating the inner first jacket layer 14*a* around which the film 14*bt* is wound in the outer first jacket layer winding step P2*bw* and the sensor portion S at 120° C. or lower and adhering the film 14*bt* of the outer first jacket layer 14*b* to the inner first jacket layer 14*a* by the adhesive layer 14*ba*. According to such a method for manufacturing the piezoelectric coaxial sensor 1, it is possible to manufacture the piezoelectric coaxial sensor 1 in which since the inner first jacket layer 14*a* is not adhered to the sensor portion S, the sensor portion S is easily led out, and since the outer first jacket layer 14*b* is adhered to the inner first jacket layer 14*a*, the first jacket layer 14 is prevented from unraveling even when the piezoelectric coaxial sensor 1 is bent. In addition, according to the method for manufacturing the piezoelectric coaxial sensor 1 of one or more embodiments, since the first jacket layer 14 is formed by heating at 120° C. or lower, it is possible to suppress a decrease in polarization of PVDF.

In addition, in the method for manufacturing the piezoelectric coaxial sensor of one or more embodiments, the second jacket layer forming step P4 includes the inner second jacket layer forming step P4*a* of forming the inner second jacket layer 16*a* that covers the outer peripheral surface of the second outer conductor 15 and in which the film 16*at* is not adhered to the second outer conductor 15, and the outer second jacket layer forming step P4*b* of forming the outer second jacket layer 16*b* that is the outermost jacket layer of the second jacket layer 16, covers the outer peripheral surface of the inner second jacket layer 16*a*, and in which the film 16*bt* is adhered to the inner second jacket layer 16*a* by the adhesive layer 16*ba*. According to such a method for manufacturing the piezoelectric coaxial sensor 1, it is possible to manufacture the piezoelectric coaxial sensor 1 in which since the inner second jacket layer 16*a* is not adhered to the second outer conductor 15, the second outer conductor 15 is easily led out, and since the outer second jacket layer 16*b* is adhered to the inner second jacket layer 16*a*, the second jacket layer 16 is prevented from unraveling even when the piezoelectric coaxial sensor 1 is bent. In addition, as described above, according to the method for manufacturing the piezoelectric coaxial sensor 1 of one or more embodiments, since the second jacket layer 16 is formed by heating at 120° C. or lower, it is possible to suppress a decrease in polarization of PVDF.

Although embodiments have been described by the above examples, the present invention is not limited to the above embodiments. For example, the second outer conductor 15 and the second jacket layer 16 are not essential configurations. When the piezoelectric coaxial sensor 1 does not include the second outer conductor 15 or the second jacket layer 16, the outer first jacket layer 14*b* of the first jacket layer 14 is the jacket layer exposed to the outside. Thus, in this case, in the outer first jacket layer 14*b*, the film 14*bt* is adhered to the member in contact with the adhesive layer 14*ba* by the adhesive layer 14*ba*. The adhesive layer 14*ba* is heated to the melting point or higher of the adhesive layer 14*ba* and 120° C. or lower, and the film 14*bt* is adhered to the member in contact with the adhesive layer 14*ba*. This member is the inner first jacket layer 14*a* in the above example, but is the sensor portion S when the inner first jacket layer 14*a* is omitted. In addition, when the piezoelectric coaxial sensor 1 does not include the second outer conductor 15 or the second jacket layer 16, the outer first jacket layer forming step P2*b* is the exposed jacket forming step of forming the jacket layer exposed to the outside.

In addition, when the first jacket layer 14 does not include the inner first jacket layer 14*a*, the inner first jacket layer forming step P2*a* is omitted, and the film 14*bt* of the outer first jacket layer is adhered to the sensor portion S by the adhesive layer 14*ba*. In addition, when the first jacket layer 14 does not include the outer first jacket layer 14*b*, the outer first jacket layer forming step P2*b* is omitted. Note that, in this case, the second jacket layer 16 is an essential configuration.

In addition, when the second jacket layer 16 does not include the inner second jacket layer 16*a*, the inner second jacket layer forming step P4*a* is omitted, and the film 16*bt* of the outer second jacket layer is adhered to the second outer conductor 15 by the adhesive layer 16*ba*. Note that when the piezoelectric coaxial sensor 1 includes the second jacket layer 16, the outer second jacket layer 16*b* is an essential configuration.

The content of one or more embodiments of the present invention will be described below more specifically with reference to an example and comparative examples, but the present invention is not limited thereto.

First Example

A piezoelectric coaxial sensor having substantially the same configuration as the piezoelectric coaxial sensor 1 illustrated in FIGS. 1 and 2 and a length of 100 cm was manufactured. First, the sensor portion S was prepared in substantially the same manner as in the preparation step P1 described above. As the center conductor 11, stranded wires including seven soft copper wires having a diameter of about 0.05 mm and having an outer diameter of about 0.15 mm were used. Unlike FIGS. 1 and 2, the polymer piezoelectric layer 12 has a configuration in which a film having a tape shape including PVDF is spirally wound on the outer peripheral surface of the center conductor 11. At this time, the film was wound so that a part of the film overlapped to form two layers. The outer diameter of the polymer piezoelectric layer 12 was 0.3 mm. The first outer conductor 13 has a configuration in which a plurality of tin-plated soft copper alloy wires having a diameter of 0.03 mm is spirally wound on the outer peripheral surface of the polymer piezoelectric layer 12. The outer diameter of the first outer conductor 13 was 0.36 mm. In this way, the sensor portion S was prepared.

Next, the first jacket layer 14 was formed to include the inner first jacket layer 14*a* and the outer first jacket layer 14*b* in the same manner as in the first jacket layer forming step P2 described above. First, in the inner first jacket layer forming step P2*a*, the inner first jacket layer 14*a* was formed. The inner first jacket layer 14*a* was formed by spirally winding the film 14*at* including polyethylene terephthalate (PET) on the outer peripheral surface of the first outer conductor 13. At this time, the film 14*at* was wound so that a part of the film 14*at* overlapped to form two layers. The outer diameter of the inner first jacket layer 14*a* was 0.38 mm. Next, the outer first jacket layer 14*b* was formed in the same manner as in the outer first jacket layer forming step P2*b*. The outer first jacket layer 14*b* was formed by spirally winding the film 14*bt* including PET on the outer peripheral surface of the inner first jacket layer 14*a* with the adhesive layer 14*ba* provided on one surface in the same manner as in the outer first jacket layer winding step P2*bw*. At this time, the film 14*bt* was wound so that a part of the film 14*bt* overlapped to form two layers. The outer diameter of the outer first jacket layer 14*b* was 0.39 mm. Note that the adhesive layer 14*ba* includes a thermoplastic resin containing EVA. Thereafter, in the same manner as in the outer first jacket layer adhering step P2*ba*, the film 14*bt* of the outer first jacket layer 14*b* was adhered to the inner first jacket layer 14*a* by the adhesive layer 14*ba*. At this time, the set temperature of the heating furnace H was set to 120° C., the length of the heating furnace was set to 1.1 m, and the linear velocity of the heating target body 1*a* was set to 3 m/min.

Next, the second outer conductor 15 was formed in the second outer conductor forming step P3. The second outer conductor 15 has a configuration in which a plurality of tin-plated soft copper alloy wires having a diameter of 0.03 mm is spirally wound on the outer peripheral surface of the first jacket layer 14. The outer diameter of the second outer conductor 15 was 0.45 mm.

Next, the inner second jacket layer 16*a* and the outer second jacket layer 16*b* were formed in the same manner as in the second jacket layer forming step P4 described above. First, in the inner second jacket layer forming step P4*a*, the inner second jacket layer 16*a* was formed. The inner second jacket layer 16*a* was formed by spirally winding the film 16*at* including PET on the outer peripheral surface of the second outer conductor 15. At this time, the film 16*at* was wound so that a part of the film 16*at* overlapped to form two layers. The outer diameter of the inner second jacket layer 16*a* was 0.47 mm. Next, the outer second jacket layer 16*b* was formed in the same manner as in the outer second jacket layer forming step P4*b*. The outer second jacket layer 16*b* was formed by spirally winding the film 16*bt* including PET on the outer peripheral surface of the inner second jacket layer 16*a* with the adhesive layer 16*ba* provided on one surface in the same manner as in the outer second jacket layer winding step P4*bw*. At this time, the film 16*bt* was wound so that a part of the film 16*bt* overlapped to form two layers. The outer diameter of the outer second jacket layer 16*b* was 0.54 mm. Note that the adhesive layer 16*ba* includes a thermoplastic resin containing EVA. Thereafter, in the same manner as in the outer second jacket layer adhering step P4*ba*, the film 16*bt* of the outer second jacket layer 16*b* was adhered to the inner second jacket layer 16*a* by the adhesive layer 16*ba*. At this time, the set temperature of the heating furnace H was set to 120° C., the length of the heating furnace was set to 1.1 m, and the linear velocity of the heating target body 1*a* was set to 3 m/min.

First Comparative Example

A piezoelectric coaxial sensor was manufactured in the same manner as in the first example except that the adhesive layer 14*ba* of the outer first jacket layer 14*b* and the adhesive layer 16*ba* of the outer second jacket layer 16*b* included an acrylic thermoplastic resin. The melting point of this thermoplastic resin was 130° C.

Second Comparative Example

A piezoelectric coaxial sensor was manufactured in the same manner as in the first example except that the adhesive layer 14*ba* of the outer first jacket layer 14*b* and the adhesive layer 16*ba* of the outer second jacket layer 16*b* included a polyester thermoplastic resin, and the set temperature of the heating furnace H in the outer first jacket layer adhering step P2*ba* and the outer second jacket layer adhering step P4*ba* was 150° C. The melting point of this thermoplastic resin was 140° C.

Third Comparative Example

A piezoelectric coaxial sensor was manufactured in the same manner as in the first example except that the adhesive layer 14*ba* of the outer first jacket layer 14*b* and the adhesive layer 16*ba* of the outer second jacket layer 16*b* included a polyamide thermoplastic resin, and the set temperature of the heating furnace H in the outer first jacket layer adhering step P2*ba* and the outer second jacket layer adhering step P4*ba* was 160° C. The melting point of this thermoplastic resin was 150° C.

The outer second jacket layer 16*b* of the first example was adhered with sufficient strength, and the outer second jacket layer 16*b* could not be easily separated.

The outer second jacket layer 16*b* of the first comparative example was not adhered with sufficient strength, and the outer second jacket layer 16*b* was easily separated. Note that even when the set temperature of the heating furnace H in the outer first jacket layer adhering step P2*ba* and the outer second jacket layer adhering step P4*ba* of the first comparative example was increased to 170° C., the same results were obtained.

The outer second jacket layer 16*b* of the second comparative example was adhered with sufficient strength, and the outer second jacket layer 16*b* could not be easily separated. Note that when the set temperature of the heating furnace H in the outer first jacket layer adhering step P2*ba* and the outer second jacket layer adhering step P4*ba* of the second comparative example was set to 120° C., the films 14bt and 16bt were not adhered.

The outer second jacket layer 16b of the third comparative example was adhered with sufficient strength, and the outer second jacket layer 16b could not be easily separated. Note that when the set temperature of the heating furnace H in the outer first jacket layer adhering step P2ba and the outer second jacket layer adhering step P4ba of the third comparative example was set to 120° C., the films 14bt and 16bt were not adhered.

Next, an external force was applied to each of the piezoelectric coaxial sensors of the first example and the first to third comparative examples from the side surface over a length of 10 mm at a pressing pressure of 10 N. At this time, the voltage generated between the center conductor 11 and the first outer conductor 13 was amplified 20 times and measured. As a result, the voltages generated in the piezoelectric coaxial sensors of the first example and the first to third comparative examples were 180 mV in the first example and the first comparative example, 50 mV in the second comparative example, and 10 mV in the third comparative example.

Next, a piezoelectric coaxial sensor having the same configuration as in the first example was manufactured by changing the set temperature of the heating furnace H in the outer first jacket layer adhering step P2ba and the outer second jacket layer adhering step P4ba. Next, an external force was applied to each of the manufactured piezoelectric coaxial sensors from the side surface over a length of 10 mm at a pressing pressure of 10 N, and the voltage generated between the center conductor 11 and the first outer conductor 13 was amplified 20 times and measured. The results are illustrated in FIG. 11.

Figure 11:
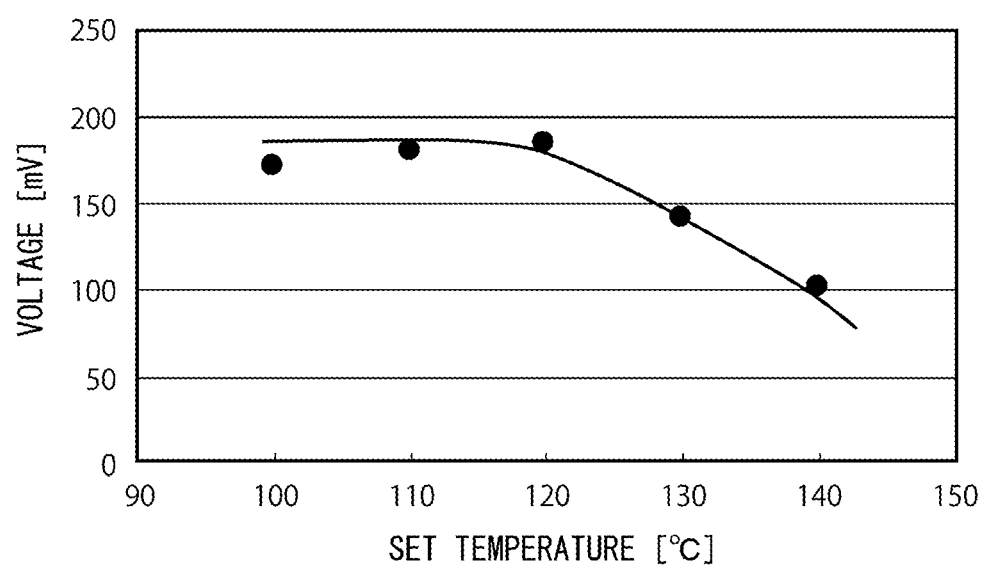
FIG. 11 is a diagram illustrating a relationship between a set temperature of a heating furnace and a measurement result of a voltage generated in the piezoelectric coaxial sensor.

FIG. 11 is a diagram illustrating a relationship with the measurement result of the voltage generated in the piezoelectric coaxial sensor when the set temperature of the heating furnace H is changed to 100° C., 110° C., 120° C., 130° C., and 140° C. As illustrated in FIG. 11, it has been found that when the set temperature of the heating furnace is 120° C. or lower, a sufficiently high voltage is obtained.

As described above, according to the method for manufacturing the piezoelectric coaxial sensor of one or more embodiments of the present invention, it is possible to manufacture a piezoelectric coaxial sensor in which deterioration of output characteristics is suppressed, and since the piezoelectric coaxial sensor of one or more embodiments of the present invention can be manufactured by heating at 120° C. or lower, it is possible to provide a piezoelectric coaxial sensor in which deterioration of output characteristics is suppressed.

As described above, according to embodiments of the present invention, a piezoelectric coaxial sensor in which deterioration of output characteristics is suppressed, a method for manufacturing the piezoelectric coaxial sensor are provided, and they are expected to be used in the field of device measurement or the like.

The invention claimed is:

1. A piezoelectric coaxial sensor comprising:
   a sensor portion including:
      a center conductor having a linear shape;
      a polymer piezoelectric layer containing polyvinylidene fluoride and that covers an outer peripheral surface of the center conductor, and
      a first outer conductor that surrounds an outer peripheral surface of the polymer piezoelectric layer; and
   jacket layers that each include a film having a tape shape wound to surround an outer peripheral surface of the sensor portion, wherein
   the film of at least one of the jacket layers exposed to the outside of the piezoelectric coaxial sensor among the other jacket layers is adhered to a member in contact with an adhesive layer, and
   the adhesive layer includes a thermoplastic resin having a melting point of 120° C. or lower.

2. The piezoelectric coaxial sensor according to claim 1, wherein the thermoplastic resin includes an ethylene-vinyl acetate copolymer.

3. The piezoelectric coaxial sensor according to claim 1, comprising:
   a first jacket layer that includes one or more of the jacket layers and that covers the outer peripheral surface of the sensor portion;
   a second outer conductor that surrounds an outer peripheral surface of the first jacket layer; and
   a second jacket layer that includes one or more of the jacket layers and that covers an outer peripheral surface of the second outer conductor,
   wherein an outermost jacket layer of the second jacket layer is the jacket layer exposed to the outside of the piezoelectric coaxial sensor.

4. The piezoelectric coaxial sensor according to claim 3, wherein
   the first jacket layer includes:
      an inner first jacket layer that covers the outer peripheral surface of the sensor portion and in which the film is not adhered to the sensor portion; and
      an outer first jacket layer that covers an outer peripheral surface of the inner first jacket layer and in which the film is adhered to the inner first jacket layer by the adhesive layer.

5. The piezoelectric coaxial sensor according to claim 3, wherein
   the second jacket layer includes:
      an inner second jacket layer that covers the outer peripheral surface of the second outer conductor and in which the film is not adhered to the second outer conductor; and
      an outer second jacket layer that is an outermost jacket layer of the second jacket layer, covers an outer peripheral surface of the inner second jacket layer, and in which the film is adhered to the inner second jacket layer by the adhesive layer.

6. A method for manufacturing a piezoelectric coaxial sensor, the method comprising:
   preparing a sensor portion including a center conductor having a linear shape, a polymer piezoelectric layer containing polyvinylidene fluoride and that covers an outer peripheral surface of the center conductor, and a first outer conductor that surrounds an outer peripheral surface of the polymer piezoelectric layer; and
   forming jacket layers that each include a film having a tape shape wound to surround an outer peripheral surface of the sensor portion, wherein
   forming the jacket layers includes forming at least one of the jacket layers exposed to outside of the piezoelectric coaxial sensor among the other jacket layers, and
   forming the at least one of the jacket layers exposed to the outside includes:
      winding the film to be the at least one of the jacket layers exposed to the outside around an outer peripheral surface of a member in contact with an adhesive layer to surround the outer peripheral surface of the sensor portion; and heating the sensor portion around which the film to be the jacket layer exposed to the outside is wound at 120° C. or lower to adhere the film to the member by the adhesive layer, the adhesive includes a thermoplastic resin having a melting point of 120° C. or lower.

7. The method for manufacturing a piezoelectric coaxial sensor according to claim 6, wherein the thermoplastic resin includes an ethylene-vinyl acetate copolymer.

8. The method for manufacturing a piezoelectric coaxial sensor according to claim 6, comprising:

forming a first jacket layer that includes one or more of the jacket layers and that covers the outer peripheral surface of the sensor portion;

forming a second outer conductor that surrounds an outer peripheral surface of the first jacket layer; and forming a second jacket layer that includes one or more of the jacket layers and that covers an outer peripheral surface of the second outer conductor, wherein an outermost jacket layer of the second jacket layer is the at least one of the jacket layers exposed to the outside.

9. The method for manufacturing a piezoelectric coaxial sensor according to claim 8, wherein forming the first jacket layer includes:

forming an inner first jacket layer that covers the outer peripheral surface of the sensor portion and in which the film is not adhered to the sensor portion; and forming an outer first jacket layer that covers an outer peripheral surface of the inner first jacket layer and in which the film is adhered to the inner first jacket layer by the adhesive layer, and forming the outer first jacket layer includes:

winding the film to be the outer first jacket layer around the outer peripheral surface of the inner first jacket layer via the adhesive layer, and heating the inner first jacket layer around which the film to be the outer first jacket layer is wound and the sensor portion at 120° C. or lower and adhering the film to be the outer first jacket layer to the inner first jacket layer by the adhesive layer.

10. The method for manufacturing a piezoelectric coaxial sensor according to claim 8, wherein forming the second jacket layer includes:

forming an inner second jacket layer that covers the outer peripheral surface of the second outer conductor and in which the film is not adhered to the second outer conductor, and forming an outer second jacket layer that is an outermost jacket layer of the second jacket layer, that covers an outer peripheral surface of the inner second jacket layer, and in which the film is adhered to the inner second jacket layer by the adhesive layer, and forming the outer second jacket layer includes forming the exposed jacket.

* * * * *